United States Patent
Yatsuda et al.

(10) Patent No.: US 10,593,556 B2
(45) Date of Patent: Mar. 17, 2020

(54) METHOD OF FABRICATING SEMICONDUCTOR DEVICE, VACUUM PROCESSING APPARATUS AND SUBSTRATE PROCESSING APPARATUS

(71) Applicant: TOKYO ELECTRON LIMITED, Tokyo (JP)

(72) Inventors: Koichi Yatsuda, Tokyo (JP); Takashi Hayakawa, Tokyo (JP); Hiroshi Okuno, Tokyo (JP); Reiji Niino, Nirasaki (JP); Hiroyuki Hashimoto, Nirasaki (JP); Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/654,307

(22) Filed: Jul. 19, 2017

(65) Prior Publication Data

US 2018/0025917 A1 Jan. 25, 2018

(30) Foreign Application Priority Data

Jul. 21, 2016 (JP) ................................. 2016-143265
Dec. 26, 2016 (JP) ................................. 2016-251394

(51) Int. Cl.
*H01L 21/311* (2006.01)
*H01L 21/67* (2006.01)
(Continued)

(52) U.S. Cl.
CPC .. *H01L 21/31144* (2013.01); *H01L 21/31116* (2013.01); *H01L 21/31127* (2013.01);
(Continued)

(58) Field of Classification Search
CPC ......... H01L 21/31144; H01L 21/67225; H01L 21/31116; H01L 21/67063;
(Continued)

(56) References Cited

U.S. PATENT DOCUMENTS

| 9,414,445 | B2 | 8/2016 | Ahmad et al. | |
|---|---|---|---|---|
| 2011/0263753 | A1* | 10/2011 | Harkal ............... | C08G 18/2845 523/415 |
| 2011/0281025 | A1* | 11/2011 | Arai ....................... | B82Y 10/00 427/130 |

FOREIGN PATENT DOCUMENTS

| JP | 07258370 | * | 9/1995 | ............. C08G 18/00 |
| JP | 09143681 A | | 11/1995 | |

(Continued)

OTHER PUBLICATIONS

Machine translation of JP 07250370 (1995).*
(Continued)

*Primary Examiner* — Nadine G Norton
*Assistant Examiner* — Mahmoud Dahimene
(74) *Attorney, Agent, or Firm* — Nath, Goldberg & Meyer; Jerald L. Meyer

(57) ABSTRACT

There is provided a method of fabricating a semiconductor device by performing a process on a substrate, which includes: forming a masking film made of a polymer having a urea bond by supplying polymerizing raw materials to a surface of the substrate on which an etching target film formed; forming an etching pattern on the masking film; subsequently, etching the etching target film with a processing gas using the etching pattern; and subsequently, removing the masking film by heating the substrate to depolymerize the polymer.

6 Claims, 21 Drawing Sheets

(51) Int. Cl.
*H01L 21/768* (2006.01)
*H01L 21/02* (2006.01)
*H01L 23/532* (2006.01)

(52) U.S. Cl.
CPC .... *H01L 21/31138* (2013.01); *H01L 21/6715* (2013.01); *H01L 21/67063* (2013.01); *H01L 21/67178* (2013.01); *H01L 21/67207* (2013.01); *H01L 21/67225* (2013.01); *H01L 21/76811* (2013.01); *H01L 21/02118* (2013.01); *H01L 21/02271* (2013.01); *H01L 21/02282* (2013.01); *H01L 23/53238* (2013.01); *H01L 23/53295* (2013.01)

(58) Field of Classification Search
CPC ......... H01L 21/76811; H01L 21/31138; H01L 21/6715; H01L 21/67207; H01L 21/31127; H01L 21/67178; H01L 23/53295; H01L 21/02118; H01L 21/02282; H01L 23/53238; H01L 21/02271
See application file for complete search history.

(56) References Cited

FOREIGN PATENT DOCUMENTS

| | | | |
|---|---|---|---|
| JP | 09143681 A | | 6/1997 |
| JP | 2005292528 A | * | 10/2005 |
| JP | 2014056884 A | | 9/2012 |
| JP | 2013098193 A | | 5/2013 |
| JP | 2014056884 A | | 3/2014 |
| JP | 2014209270 A | | 8/2014 |
| JP | 2014209270 A | | 11/2014 |
| TW | 201137935 A | | 11/2011 |
| TW | 201610610 A | | 3/2016 |

OTHER PUBLICATIONS

Translated abstract of JP-2005292528-A (2005).*
English Translation of Shirato et al. (JP 2005292528) (Year: 2005).*

* cited by examiner

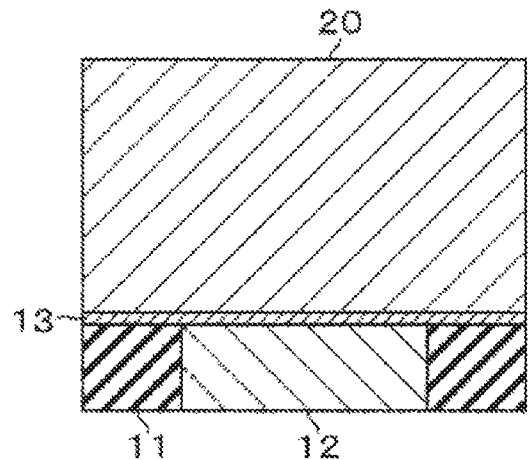
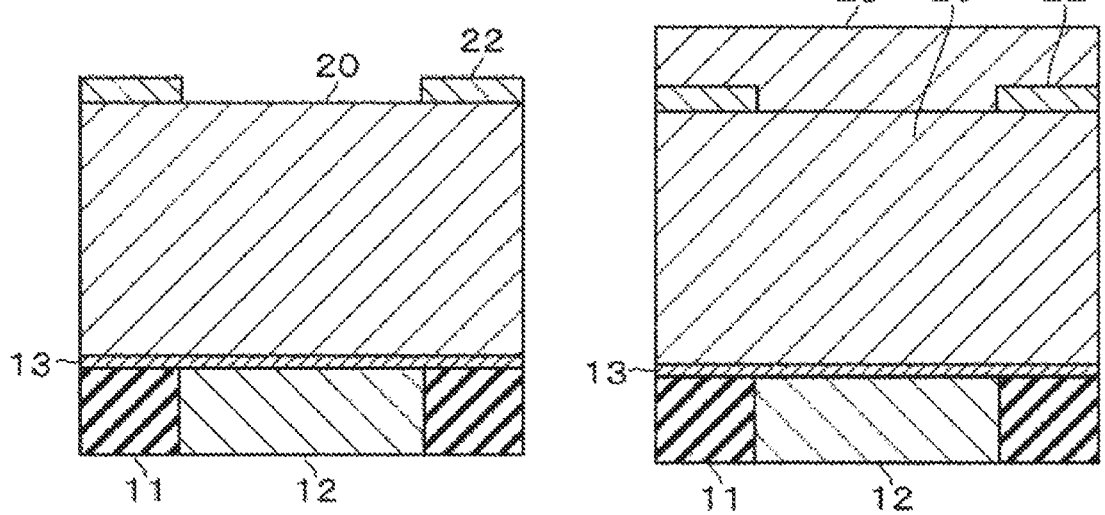

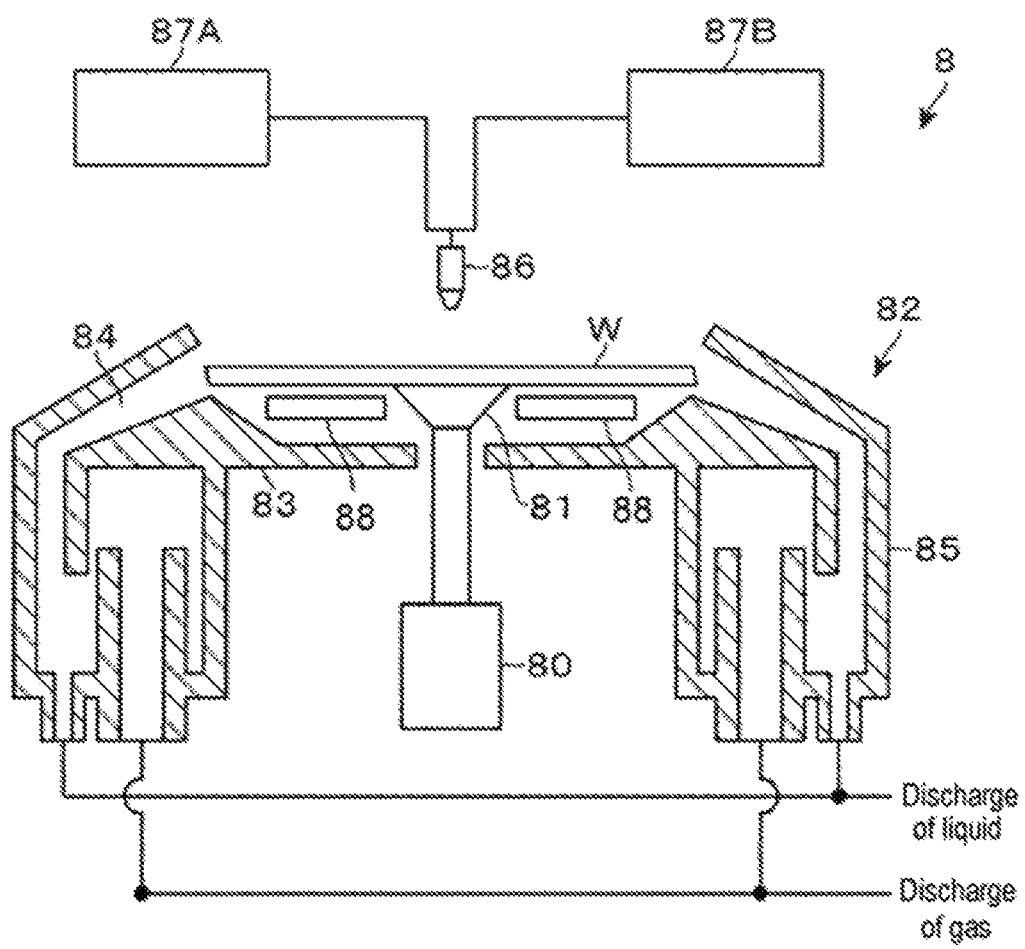

FIG. 19
R1 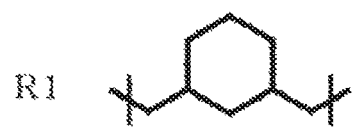
R2 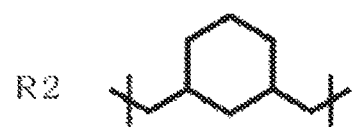
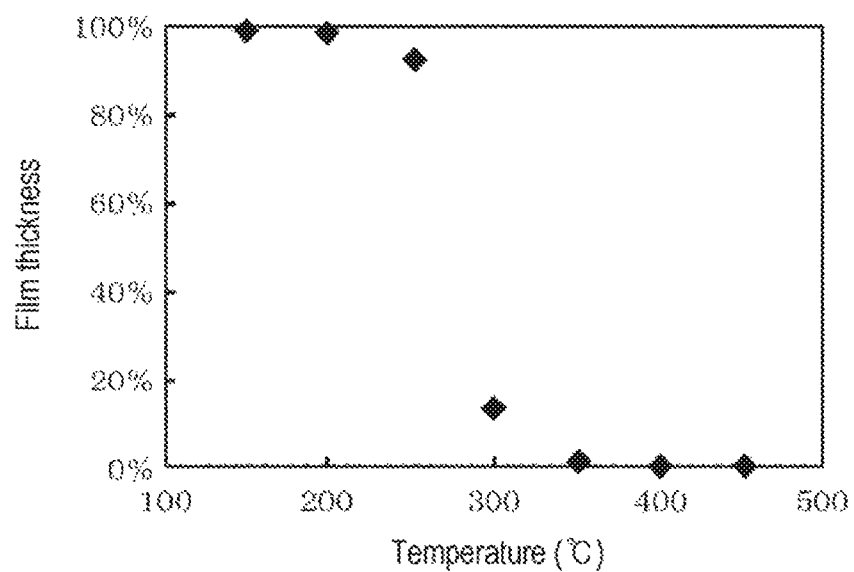

FIG. 21
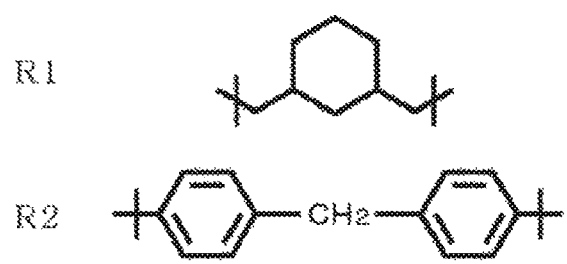
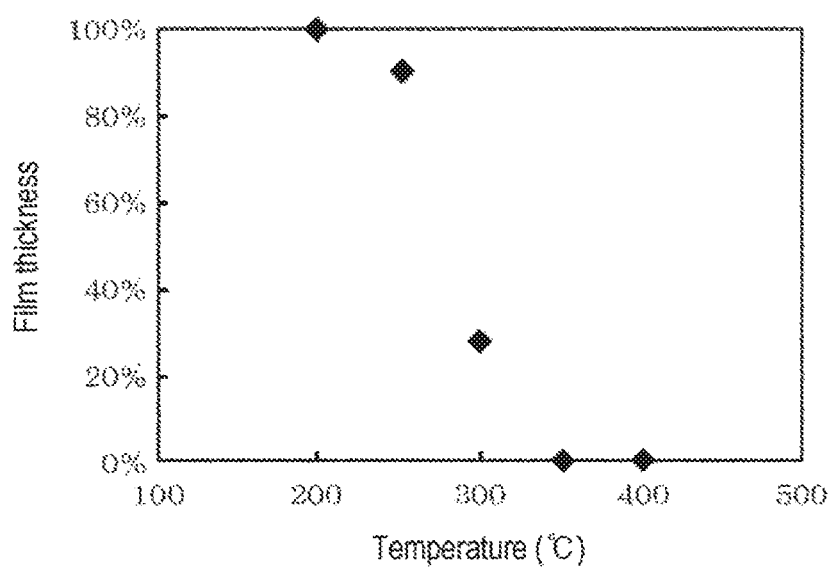

METHOD OF FABRICATING SEMICONDUCTOR DEVICE, VACUUM PROCESSING APPARATUS AND SUBSTRATE PROCESSING APPARATUS

CROSS-REFERENCE TO RELATED APPLICATIONS

This application is based upon and claims the benefit of priority from Japanese Patent Application Nos. 2016-143265 and 2016-251394, filed on Jul. 21, 2017 and Dec. 26, 2017, respectively, the entire contents of which are incorporated herein by reference.

TECHNICAL FIELD

The present disclosure relates to a technique for etching an etching target film, which is formed on a substrate used for fabricating a semiconductor device, using an etching mask.

BACKGROUND

In fabricating a multi-layered semiconductor device, as a method of reducing a parasitic capacitance of an interlayer insulating film formed on a semiconductor wafer (hereinafter, referred to as a "wafer") used as a substrate, to improve an operation rate, it is known to use a porous low-k film. This kind of film may include, for example, an SiOC film containing silicon, carbon and oxygen and having Si—C bonds. In order to cause a wiring material such as copper to be embedded, the SiOC film is etched by plasma of a CF-based gas, e.g., $CF_4$ gas, using a resist mask and a lower layer-side mask, and an ashing process is then performed on the resist mask by plasma of oxygen gas.

However, in the case where a plasma process such as the etching or the ashing is performed on the SiOC film, for example, the Si—C bonds in an exposed surface of the SiOC film exposed to the plasma, i.e., in sidewalls and bottom surfaces of recesses, are broken by the plasma, so that C is desorbed from the film. Since Si with unsaturated bonds created by the desorption of C is unstable in this state, Si is bonded with, for example, moisture in the atmosphere or the like, resulting in Si—OH.

Such a plasma process causes a damaged film to be formed on the exposed surface of the SiOC film. In such a damaged film, the content of carbon is lowered. This increases permittivity of the damaged film. As miniaturization of a line width of a wiring pattern and thinning of a wiring layer, an insulating film or the like are progressing, and the proportion of an influence of the surface portion on the entire wafer is being increased. Even in the surface portion, the increase in the permittivity of the surface becomes one of factors causing properties of the semiconductor device to be deviated from the designed values. In addition, although the mask used for etching the SiOC film is removed by generating the plasma as described above, it is preferable to remove the mask by a simpler method.

For example, there is known a technique of preliminarily embedding PMMA (acrylic resin) in pores of a porous low-k film formed on a substrate, performing a certain process such as etching on the low-k film, heating the substrate, supplying solvent to the substrate, and additionally supplying microwave to remove the PMMA. However, the removal of the PMMA requires a long time of about 20 minutes by using plasma. In addition, the substrate is required to be heated up to a temperature of 400 degrees C. or higher. Therefore, there is a problem that elements which have already been formed on the substrate are likely to be adversely affected.

SUMMARY

Some embodiments of the present disclosure provides a technique capable of easily and simply removing a mask, which is used for etching an etching target film formed on a substrate, after the etching is performed, while suppressing the damage to the etching target film.

According to one embodiment of the present disclosure, there is provided a method of fabricating a semiconductor device by performing a process on a substrate, which includes: forming a masking film made of a polymer having a urea bond by supplying polymerizing raw materials to a surface of the substrate on which an etching target film formed; forming an etching pattern on the masking film; subsequently, etching the etching target film with a processing gas using the etching pattern; and subsequently, removing the masking film by heating the substrate to depolymerize the polymer.

According to another embodiment of the present disclosure, there is provided a vacuum processing apparatus, which includes: a first etching processing module configured to etch a substrate with a processing gas inside a first vacuum container, and configured to transfer a mask pattern to a masking film, the substrate having an etching target film, the masking film made of a polymer having a urea bond and formed on the etching target film, and a film having the mask pattern and formed on the masking film; and a second etching processing module configured to etch the etching target film formed on the substrate etched in the first etching processing module, with the processing gas by using the masking film as a mask inside a second vacuum container.

According to another embodiment of the present disclosure, there is provided a substrate processing apparatus, which includes: a film forming part configured to form a masking film on a surface of a substrate on which an etching target film formed, the masking film being made of a polymer having a urea bond; a resist applying part configured to apply a resist on the substrate with the masking film formed thereon; a pre-exposure heating processing part configured to heat the substrate with the resist applied thereto; a post-exposure heating processing part configured to heat the substrate after exposure; a developing part configured to develop the heated substrate; and a transfer mechanism configured to transfer the substrate between respective processing parts configured to process the substrate, wherein the film forming part includes a mounting table configured to mount the substrate thereon, and a raw material discharge part configured to supply polymerizing raw materials to the substrate mounted on the mounting table in the form of liquid or mist.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 1A to 1C are explanatory views illustrating some of processes of a semiconductor device fabricating method according to an embodiment of the present disclosure.

FIG. 13 is a longitudinal sectional side view of a masking-film forming module installed in the coating/developing apparatus.

FIG. 19 is a graph showing the results of an evaluation test.

FIG. 21 is a graph showing the results of an evaluation test.

DETAILED DESCRIPTION

Figure 2D:
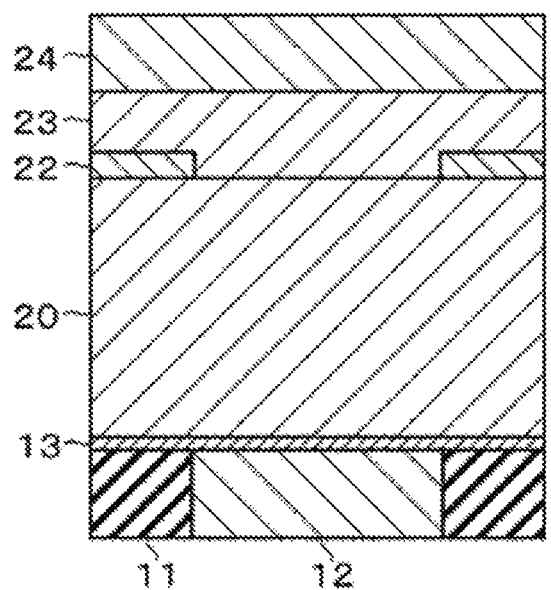
FIGS. 2D to 2F are explanatory views illustrating some of the processes of the semiconductor device fabricating method according to the embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment in which a semiconductor device fabricating method according to the present disclosure is applied to a process of forming wirings in a semiconductor device will be described. This process of forming wirings is a dual damascene process performed on a wafer W used as a substrate. FIGS. 1 to 5 are explanatory views that step-by-step illustrate states where an upper layer-side circuit portion is formed on a lower layer-side circuit portion. In the figures, reference numeral "11" indicates, for example, an interlayer insulating film formed at a lower layer-side, "12" indicates a wiring material embedded in the interlayer insulating film 11, and "13" indicates an etching stopper film that functions as a stopper during etching. The etching stopper film 13 is formed of, for example, SiC (silicon carbide), SiCN (silicon carbon nitride) or the like.

A low-k film 20, which is an interlayer insulating film, is formed on the etching stopper film 13. In this embodiment, an SiOC film is employed as the low-k film 20. The SiOC film is formed by, for example, a CVD (chemical vapor deposition) method using a plasmarized DEMS (diethoxymethylsilane). Therefore, the low-k film 20 contains silicon, carbon and oxygen as main components. In addition, for example, the SiOC film is also used as the interlayer insulating film 11 formed at the lower layer-side.

In this embodiment, a sequence is started from a state where the lower layer-side circuit portion is formed on a surface of the wafer W as shown in FIG. 1A, and subsequently, the low-k film 20 is formed on the lower layer-side circuit portion. From this state, descriptions will be made on a process of forming a via hole and a trench (a groove for burying a wiring) on the low-k film 20 and subsequently, burying the wiring in the trench.

First, as shown in FIG. 1B, a hard mask 22 used as an etching pattern mask, which is made of, for example, a titanium nitride (TiN) film, is formed on a surface of the low-k film 20 by a known method. In the hard mask, a portion corresponding to the trench is opened.

Figure 6:
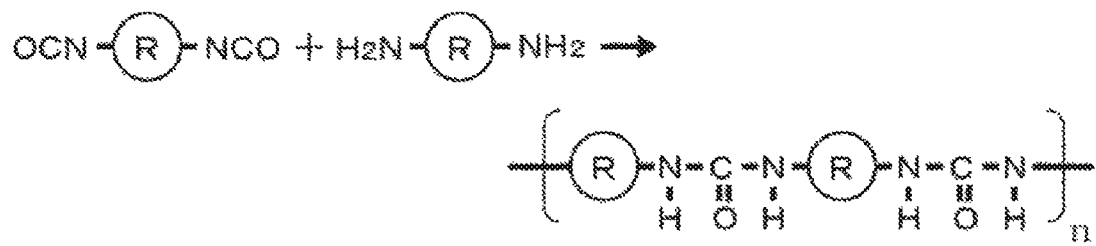
FIG. 6 is an explanatory view illustrating a state where a polymer having a urea bond is produced by a copolymerization-based reaction.

Subsequently, a polyurea film 23, which is a masking film serving as a mask when etching the via hole, is formed on the hard mask 22 and the low-k film 20 (FIG. 1C). This polyurea film 23 may be formed by copolymerizing isocyanate and amine as raw material monomers to form a urea bond, as shown in FIG. 6 by way of example. "R" is, for example, an alkyl group (straight-chain alkyl group or cyclic alkyl group) or an aryl group, and "n" is an integer of 2 or more.

For example, an alicyclic compound or an aliphatic compound may be used as the amine. The alicyclic compound may include, for example, 1,3-bis (aminomethyl) cyclohexane ($H_6XDA$). The aliphatic compound may include, for example, 1,12-diaminododecane (DAD). For example, an alicyclic compound, an aliphatic compound, an aromatic compound or the like can be used as the isocyanate. The alicyclic compound may include, for example, 1,3-bis (isocyanatomethyl) cyclohexane ($H_6XDI$) and the aliphatic compound may include, for example, hexamethylene diisocyanate.

Figure 7:
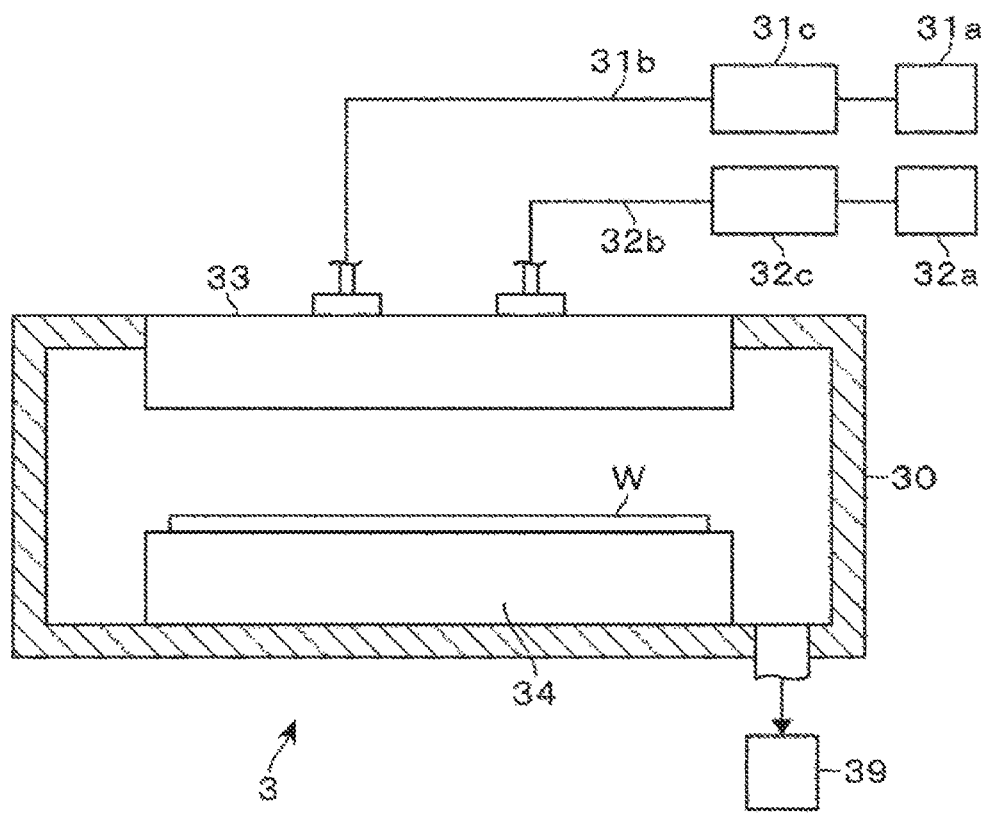
FIG. 7 is a sectional view illustrating an apparatus for producing a polymer having a urea bond by reacting isocyanate vapor with amine vapor.

FIG. 7 shows a CVD apparatus 3 for forming the polyurea film 23 by a vapor deposition polymerization by supplying gases containing the aforementioned raw material monomers to the wafer W. In FIG. 7, reference numeral 30 indicates a vacuum container for providing a vacuum atmosphere, and reference numeral 39 is an exhaust mechanism for exhausting the vacuum container 30 to form the vacuum atmosphere. Reference numerals 31a and 32a indicate raw material supply sources in which isocyanate and amine as the raw material monomers are accommodated in liquid forms, respectively. The liquid isocyanate and the liquid amine are vaporized by vaporizers 31c and 32c installed in supply pipes 31b and 32b, respectively. Each vapor is introduced into a shower head 33 which is a gas-discharging part.

The shower head 33 has a plurality of discharging holes formed in a lower surface thereof and is configured to discharge the isocyanate vapor and the amine vapor into a treatment atmosphere via the respective discharging holes. The wafer W is mounted on a mounting table 34 having a temperature-adjusting mechanism. In a state where an inside of the vacuum container 30 is under a vacuum atmosphere of a predetermined pressure, the isocyanate vapor and the amine vapor are supplied to the wafer W such that they is subjected to a vapor deposition-polymerization on the surface of the wafer W. Thus, the aforementioned polyurea film 23 is formed. An internal temperature of the vacuum container 30 during the vapor deposition-polymerization may be determined according to the kinds of the raw material monomers, and may be, for example, 40 to 150 degrees C. For example, when the vapor pressures of the raw material monomers are relatively low, a temperature of the wafer W may be relatively high, whereas when the vapor pressures of the raw material monomers are relatively high, the temperature of the wafer W may be relatively low. A film thickness of the polyurea film 23 may be determined depending on, for example, a refractive index or an extinction coefficient of the poly urea film 23.

After the polyurea film 23 is formed, a mask film 24 is formed on the polyurea film 23. The mask film 24 is, for example, an $SiO_2$ (silicon oxide) film, and may use, for example, a silicon-based anti-reflection film. The mask film 24 is formed by, for example, a low pressure chemical vapor deposition (LPCVD) method or an atomic layer deposition (ALD) method. If the $SiO_2$ (silicon oxide) film is formed as the mask film 24 by the LPCVD method, for example, a silane gas and an oxidizing gas are used as raw material gases.

Figure 2E:
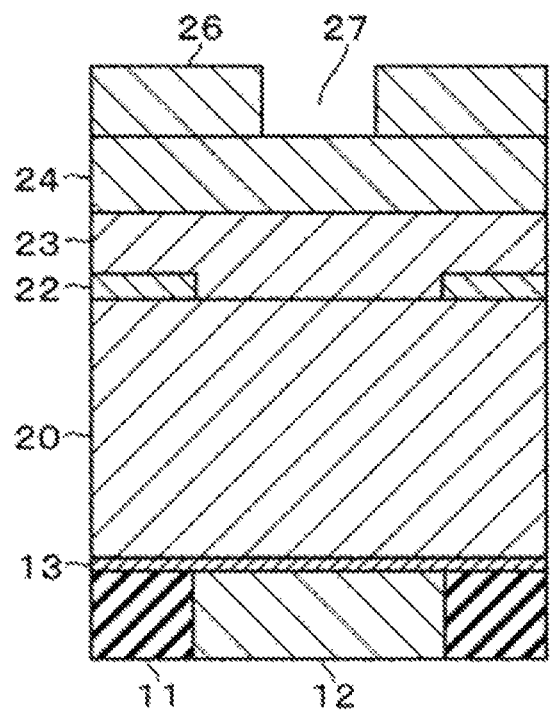
Figure 2F:
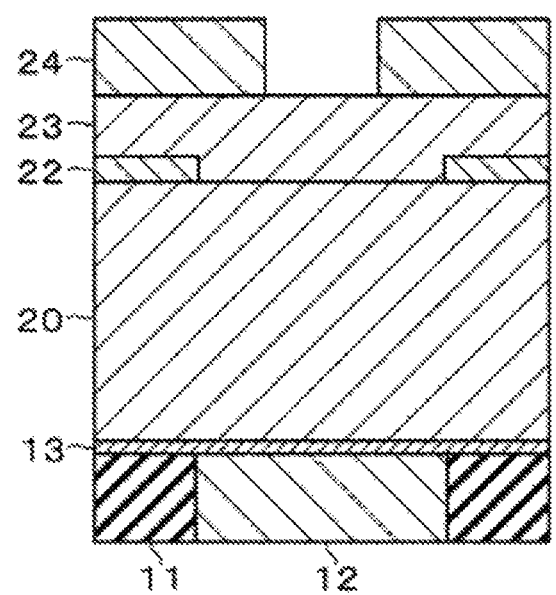

Subsequently, a resist film 26 is formed on the mask film 24. The resist film 26 is then exposed and developed to form a resist pattern having an opening 27 formed at a portion corresponding to a via hole (FIG. 2E). The mask film 24 is etched using the resist pattern (FIG. 2F).

Figure 3G:
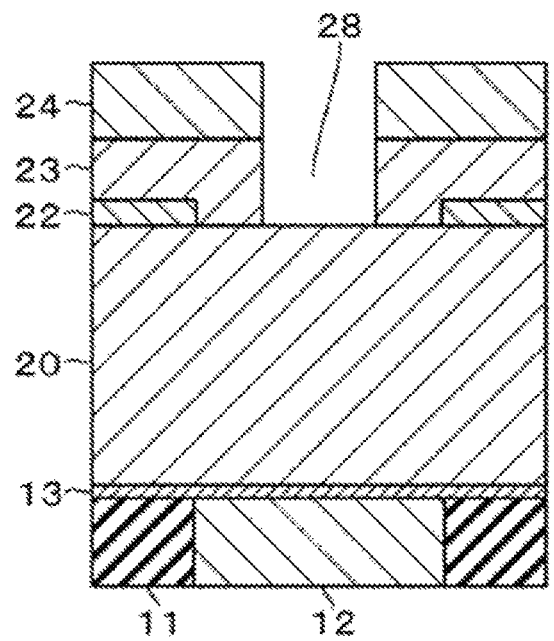
FIGS. 3G and 3H are explanatory views illustrating some of the processes of the semiconductor device fabricating method according to the embodiment of the present disclosure.
Figure 3H:
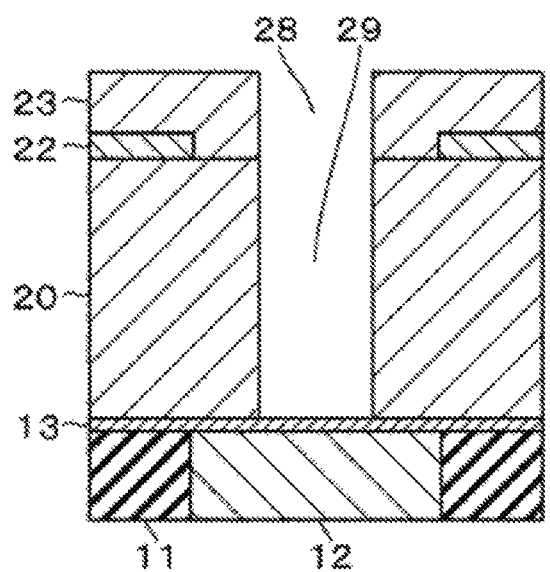

As for the etching, if the mask film 24 is the $SiO_2$ film, the etching is performed with plasma obtained by plasmarizing, for example, $CH_3F$ gas. Further, the poly urea film 23 is etched using the mask film 24 as a mask, thereby forming an opening 28 at a portion corresponding to the via hole (FIG. 3G). At this time, the etching may be performed with plasma obtained by plasmarizing, for example, $O_2$ (oxygen) gas. $CO_2$ (carbon dioxide) gas, $NH_3$ (ammonia) gas or a mixed gas of $N_2$ (nitrogen) gas and $H_2$ (hydrogen) gas. Subsequently, the low-k film 20 is etched using the polyurea film 23 as an etching mask to form a via hole 29 (FIG. 3H). A method of etching the low-k film 20 (the SiOC film, in this embodiment) may be performed with the plasma obtained by plasmarizing a processing gas, for example, the $C_6F_6$ gas. In this case, a small amount of the oxygen gas may also be added. Moreover, the mask film 24 formed on the polyurea film 23 is removed in this etching process.

Thereafter, the etching stopper film 13 formed at a bottom of the via hole 29 is etched and removed. If the etching stopper film 13 is, for example, the SiC film, this etching may be performed with the plasma obtained by plasmarizing $CF_4$ gas. A sequence of processes starting from the formation of the polyurea film 23 to the etching of the etching stopper film 13 requires treating the poly urea at a temperature lower than a temperature at which the polyurea is depolymerized. Therefore, the process temperature of the wafer W when each of the films is etched is, for example, 100 degrees C. or less. The process temperature of the wafer W is, for example, the room temperature to 200 degrees C., when each of the films is formed by the CVD or ALD method.

Figure 4I:
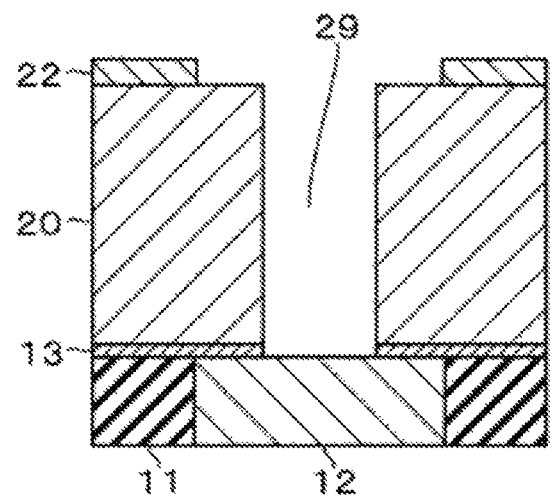
FIGS. 4I and 4J are explanatory views illustrating some of the processes of the semiconductor device fabricating method according to the embodiment of the present disclosure.

Thereafter, the polyurea film 23 is removed (FIG. 4I). If the polyurea is heated at a temperature of 300 degrees C. or higher, for example, 350 degrees C., the polyurea is depolymerized to amine and is vaporized. In this case, in order to prevent the polyurea from adversely affecting an element, which has already been formed on the wafer W, in particular, a copper wiring, it is desirable to heat the polyurea at a temperature of 400 degrees C. or less, for example, 390 degrees C. or less, specifically 300 to 350 degrees C. A period of time required for depolymerizing the polyurea, e.g., a period of time required for heating the polyurea at a temperature of 300 to 400 degrees C., may be, for example, 5 minutes or less from the viewpoint of suppressing the thermal damage to the element. Therefore, examples of the heating recipe may include a temperature of 350 degrees C. and a period of time of 5 minutes or less. An infrared lamp may be used as such a heating method. In some embodiments, the wafer W may be placed on a mounting table with a heater built therein such that the wafer W is heated. A heating atmosphere is, for example, an atmosphere of an inert gas such as a nitrogen gas.

Figure 4J:
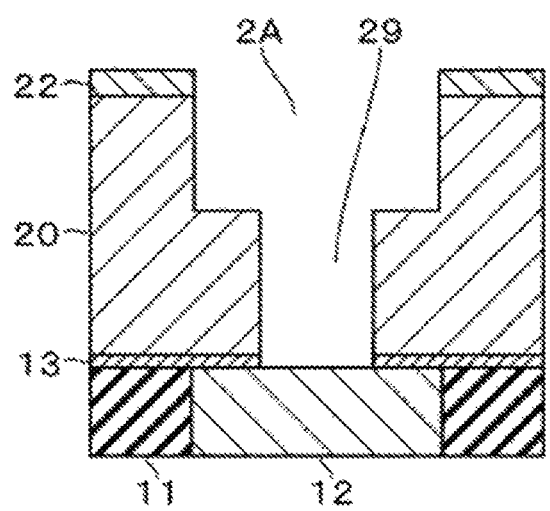
Figure 5K:
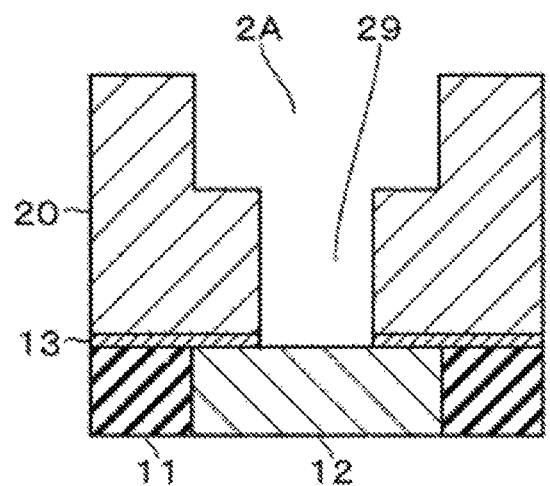
FIGS. 5K and 5L are explanatory views illustrating some of the processes of the semiconductor device fabricating method according to the embodiment of the present disclosure.
Figure 5L:
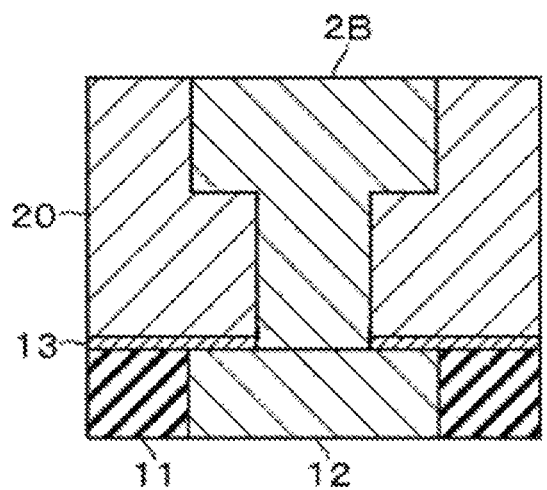

Subsequently, the low-k film 20 is etched using the hard mask 22 to form a trench 2A in a region surrounding the via hole 29, in the same manner as the process of forming the via hole 29 (FIG. 4J). Thereafter, the hard mask 22 is removed (FIG. 5K). When the hard mask 22 is a TiN film, the hard mask 22 may be removed by a wet etching using, for example, a mixed solution of sulfuric acid, hydrogen peroxide and water as an etchant. Subsequently, cooper is embedded in the via hole 29 and the trench 2A, and excess copper is removed by the chemical mechanical polishing (CMP) method to form a copper wiring 2B. Thus, an upper layer-side circuit portion is formed (FIG. 5L). Although not shown in FIG. 5L, before the formation of the copper wiring 2B, for example, a barrier metal layer composed of a laminated film of Ti and TiON and a seed layer made of copper are formed in the via hole 29 and the trench 2A.

According to this method, the polyurea film 23 serving as an etching mask when the low-k film 20 formed on the wafer W is etched is formed by the vapor deposition polymerization, and the low-k film 20 is etched to form the via hole 29. Thereafter, the wafer W is heated at a temperature below 400 degrees C. to depolymerize the polyurea and to remove the polyurea film 23. Therefore, since there is no need for exposing the low-k film 20 to the plasma when the etching mask of the low-k film 20 is removed, the damage to the surface of the low-k film 20 is suppressed. As a result, an increase in the permittivity of the low-k film 20 is suppressed. This prevents an increase in capacitance between the wirings, thus fabricating a highly reliable semiconductor product from the wafer W. In addition, the fact that it is unnecessary to expose the low-k film 20 to the plasma means that there is no need for forming a film for protecting the low-k film 20 from the plasma upon removal of the polyurea film 23, between the low-k film 20 and the polyuria film 23. Therefore, according to this method, an increase in the number of treatment processes is suppressed. Since it is also unnecessary to use the plasma in order to remove the polyuria film 23, the removal of the polyurea film 23 can be easily performed. Thus, a configuration of a depolymerizing module 50 that performs such a removal process can be simplified. Further, since the polyurea contains an amide group and a hydrogen bond is formed between an amide group constituting one polymer and an amide group constituting another polymer, the polyuria has a relatively high chemical resistance and a practically sufficient heat-resistance property of approximately 200 degrees C. In other words, the polyurea film 23 has properties suitable as a mask.

Figure 8:
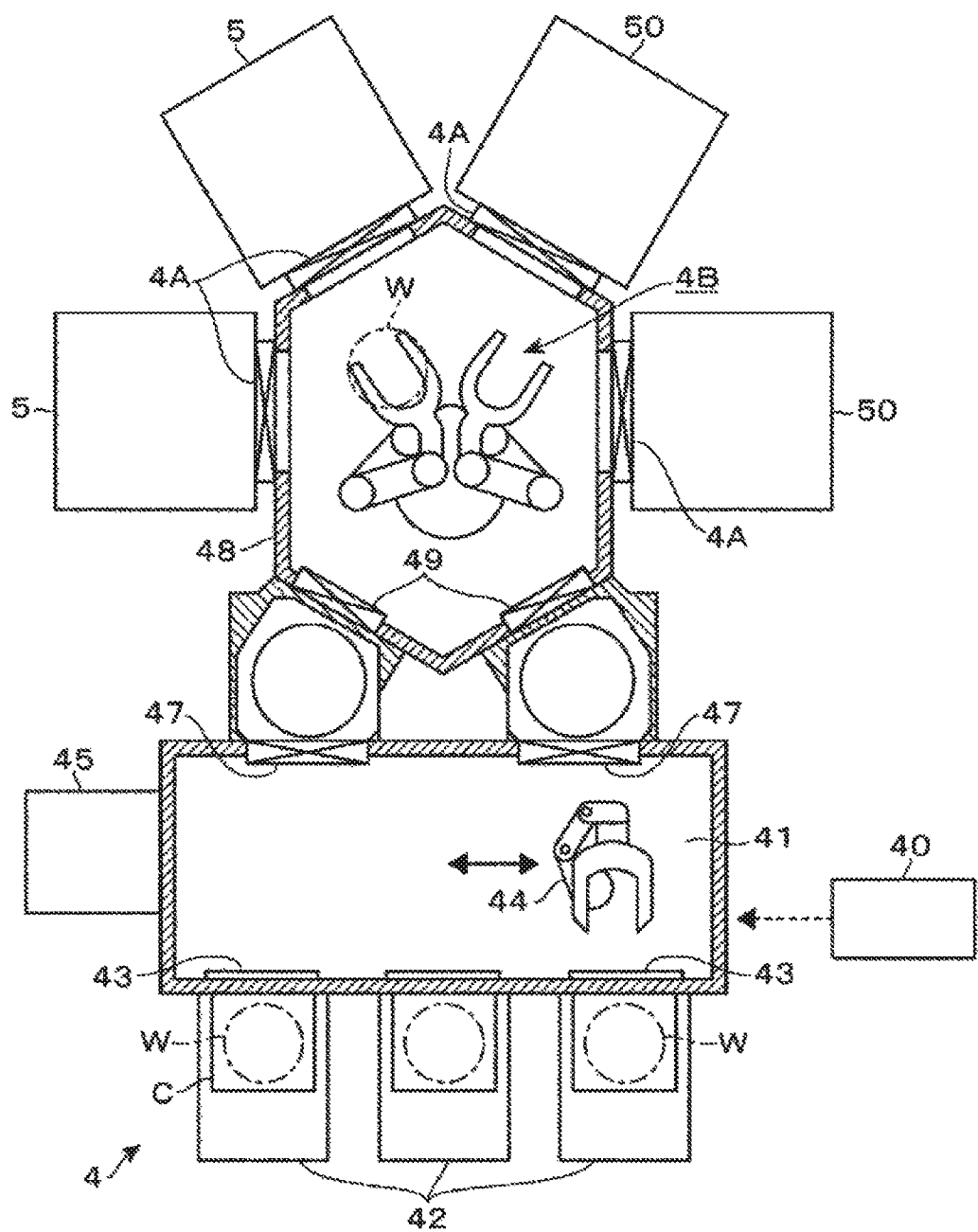
FIG. 8 is a plan view of a vacuum processing apparatus for implementing the semiconductor device fabricating method.

Subsequently, a vacuum processing apparatus 4 that performs processes from the formation of the resist pattern to the depolymerization of the polyurea film 23 in a sequence of processes described above, will be described with reference to a plan view of FIG. 8. The vacuum processing apparatus 4 includes a horizontally-extended normal pressure transfer chamber 41 of which an internal atmosphere is set to a normal pressure atmosphere by, for example, a dry nitrogen gas. At the front of the normal pressure transfer chamber 41, loading/unloading ports 42 are arranged in a left-right direction to allow carriers C to be mounted thereon. Doors 43 configured to be opened and closed together with covers of the respective carriers C are installed in a front wall of the normal pressure transfer chamber 41. A first transfer mechanism 44 configured by articulated arms for transferring the wafer W is installed inside the normal pressure transfer chamber 41. In addition, an alignment chamber 45 for adjusting an orientation or eccentricity of the wafer W is installed in a left side wall of the normal pressure transfer chamber 41 when viewed from the loading/unloading port 42 side.

At a side of the normal pressure transfer chamber 41 opposite to the loading/unloading ports 42, for example, two load lock chambers 46A and 46 B are arranged side by side. A gate valve 47 is installed between each of the load lock chambers 46A and 46B and the normal pressure transfer chamber 41. A vacuum transfer chamber 48 is disposed via gate valves 49 at inner sides of the load lock chambers 46A and 46B when viewed from the normal pressure transfer chamber 41 side.

Two etching processing modules 5 and two depolymerizing modules 50 are coupled to the vacuum transfer chamber 48 via gate valves 4A. A second transfer mechanism 4B having two transfer arms composed of articulated arms is installed within the vacuum transfer chamber 48. The wafer W is transferred and received between the load lock chambers 46A and 46B, the etching processing modules 5 and the depolymerizing modules 50 by the second transfer mechanism 4B.

Figure 9:
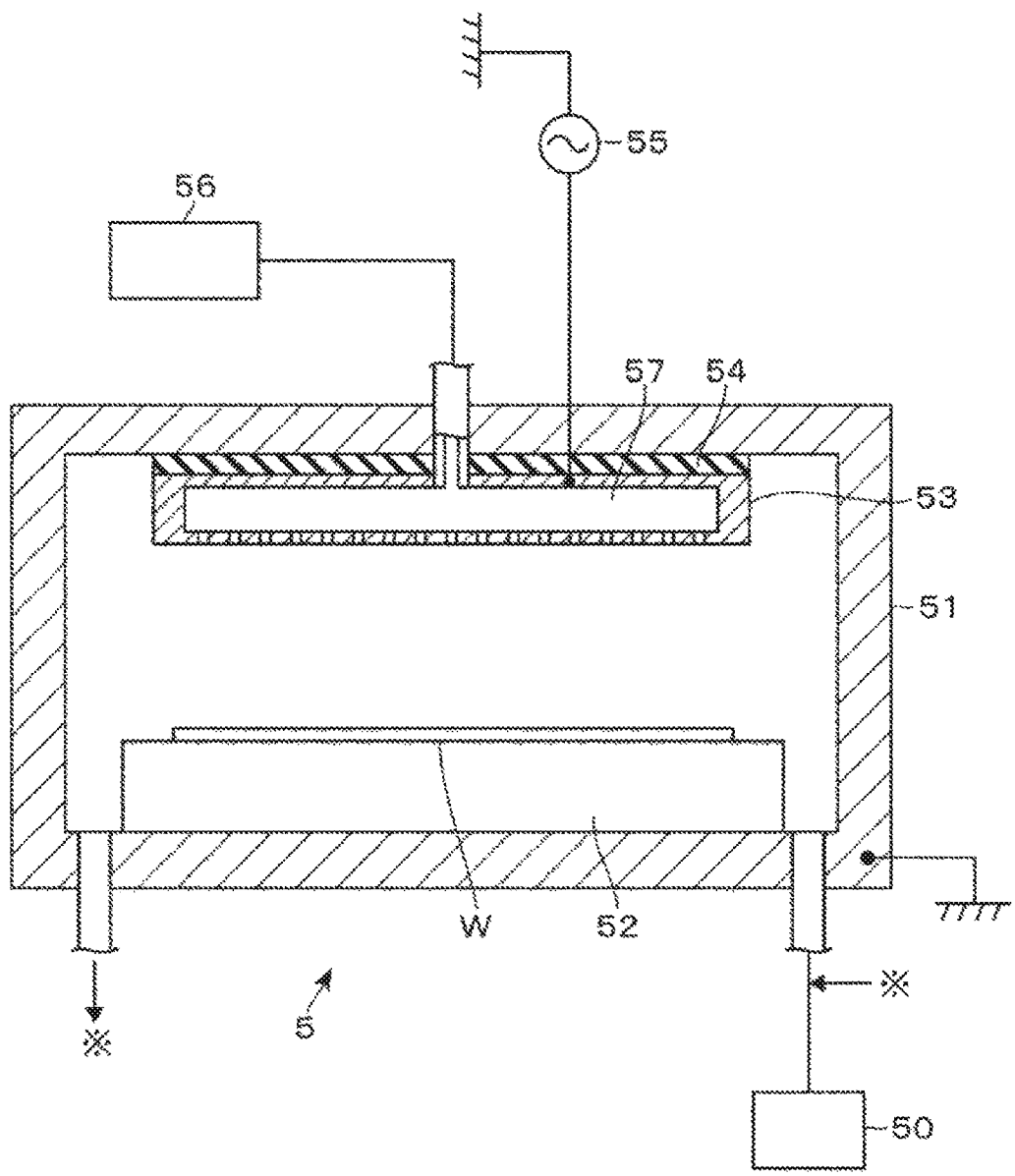
FIG. 9 is a longitudinal sectional side view of an etching processing module installed in the vacuum processing apparatus.

Subsequently, the etching processing module 5 will be described with reference to FIG. 9 which is a longitudinal sectional side view. The etching processing module 5 is configured to generate the capacitively-coupled plasma and to perform the aforementioned etching process using the plasma. In FIG. 9, reference numeral 51 denotes a grounded processing container which is coupled to the vacuum transfer chamber 48 via the gate valve 4A described with reference to FIG. 8. The processing container 51 is exhausted by an exhaust mechanism 59, so that the interior of the processing container 51 is under a vacuum atmosphere at a desired pressure.

Reference numeral 52 in FIG. 9 denotes a mounting table on which the wafer W is mounted. A heater for heating the wafer W is embedded in the mounting table 52. The mounting table 52 is disposed on a bottom surface of the processing container 51 while being electrically connected to the bottom surface. The mounting table 52 also serves as a lower electrode and functions as an anode electrode. Moreover, the mounting table 52 includes lift pins (not shown) which protrude or are retracted with respect to a surface of the mounting table 52 to support a rear surface of the wafer W, so that the wafer W is transferred between the mounting table 52 and the second transfer mechanism 4B.

A shower head 53 is installed above the mounting table 52 so as to face an upper surface of the mounting table 52. In FIG. 9, reference numeral 54 denotes an insulating member for insulating the shower head 53 from the processing container 51. A high-frequency power source 55 for generating the plasma is connected to the shower head 53. The shower head 53 functions as a cathode electrode. In FIG. 9, reference numeral 56 denotes a gas supply part which independently supplies the etching gases used for etching the aforementioned respective films to a diffusion space 57 defined within the shower head 53. The etching gases supplied to the diffusion space 57 are then supplied in a shower fashion from discharging holes of the shower head 53 to the wafer W. When the etching gases are supplied to the wafer W in this manner, the high-frequency power supply 55 is turned on so that an electric field is formed between the electrodes to plasmarize the etching gases, whereby the etching of the film on the surface of the wafer W is performed.

Next, the depolymerizing module 50 which is a removal module for removing the polyurea film 23 will be described. Similarly to the etching processing module 5, the depolymerizing module 50 includes a processing container 51 of which an interior is under a vacuum atmosphere. In other words, the depolymerizing module 50 includes the processing container 51 that is separate from that of the etching processing module 5. As in the processing container 51 of the etching processing module 5, the mounting table 52 having a heater installed therein is installed within the processing container 51 of the depolymerizing module 50, so that the wafer W mounted on the mounting table 52 is heated at the aforementioned temperature to perform the depolymerization of the polyurea film 23. Further, the depolymerizing module 50 is provided with, for example, an inert gas supply part for supplying an inert gas into the processing container 51. As a result, when the wafer W is heated as described above, the interior of the processing container 51 is under an inert gas atmosphere.

The vacuum processing apparatus 4 includes a control part 40 which is a computer. The control part 40 includes a program, a memory and a CPU. This program is stored in a computer storage medium such as a compact disk, a hard disk, a magneto-optical disk or the like and is installed in the control part 40. The control part 40 outputs control signals to respective parts of the vacuum processing apparatus 4 according to the program, and controls operations of the respective parts. Specifically, a group of instructions is stored in this program so as to control various operations such as the transfer operation of the wafer W, the supply or interruption operation of each gas to the wafer W in each of the modules 5 and 50, the turning-on/off operation of the high-frequency power source 55 and the like in the vacuum processing apparatus 4, thereby performing the sequence of processes described in connection with FIG. 2E to FIG. 4I on the wafer W.

The operation of the vacuum processing apparatus 4 will be described. Once the carrier C accommodating the wafer W with the resist pattern formed therein as shown in FIG. 2E is mounted on the loading/unloading port 42, the wafer W in the carrier C is taken out and then transferred in the order of the normal pressure transfer chamber 41, the alignment chamber 45 and the load lock chamber 46A by the first transfer mechanism 44. Thereafter, the wafer W transferred in the order of the vacuum transfer chamber 48 and the etching processing module 5 by the second transfer mechanism 4B. Thereafter, the etching of the mask film 24 using the plasmarized $CH_3F$ gas described in FIG. 2F, the etching of the poly urea film 23 using the plasmarized oxygen gas described in FIG. 3G and the etching of the low-k film 20 using the plasmarized $C_6F_6$ gas described in FIG. 3H are performed in this order.

Thereafter, the wafer W is transferred in the order of the vacuum transfer chamber 48 and the depolymerizing module 50 by the second transfer mechanism 4B, and subsequently, the wafer W is mounted on and heated by the mounting table 52 of the module 5. As shown in FIG. 4I, the polyuria film 23 is depolymerized and removed. Then, the wafer W is transferred in the order of the vacuum transfer chamber 48 and the load lock chamber 46B by the second transfer mechanism 4B and returned to the carrier C by the first transfer mechanism 44.

In the vacuum processing apparatus 4, the process of transferring the resist pattern (mask pattern) to the polyurea film 23 which is the masking film, and the process of etching the low-k film 20, which is an etching target film, using the polyurea film 23 as the mask, are performed in a single etching processing module 5. In other words, a first etching processing module for transferring the resist pattern and a second etching processing module for etching the low-k film 20 are configured to have a shared common vacuum container. With such a configuration, manufacturing and operation costs of the apparatus can be reduced. However, the transfer of the mask pattern to the poly urea film and the etching of the low-k film 20 may be performed in different etching processing modules 5. In other words, the present disclosure is not limited to a configuration in which all the etching processes are performed in a single etching processing module 5.

Figure 11:
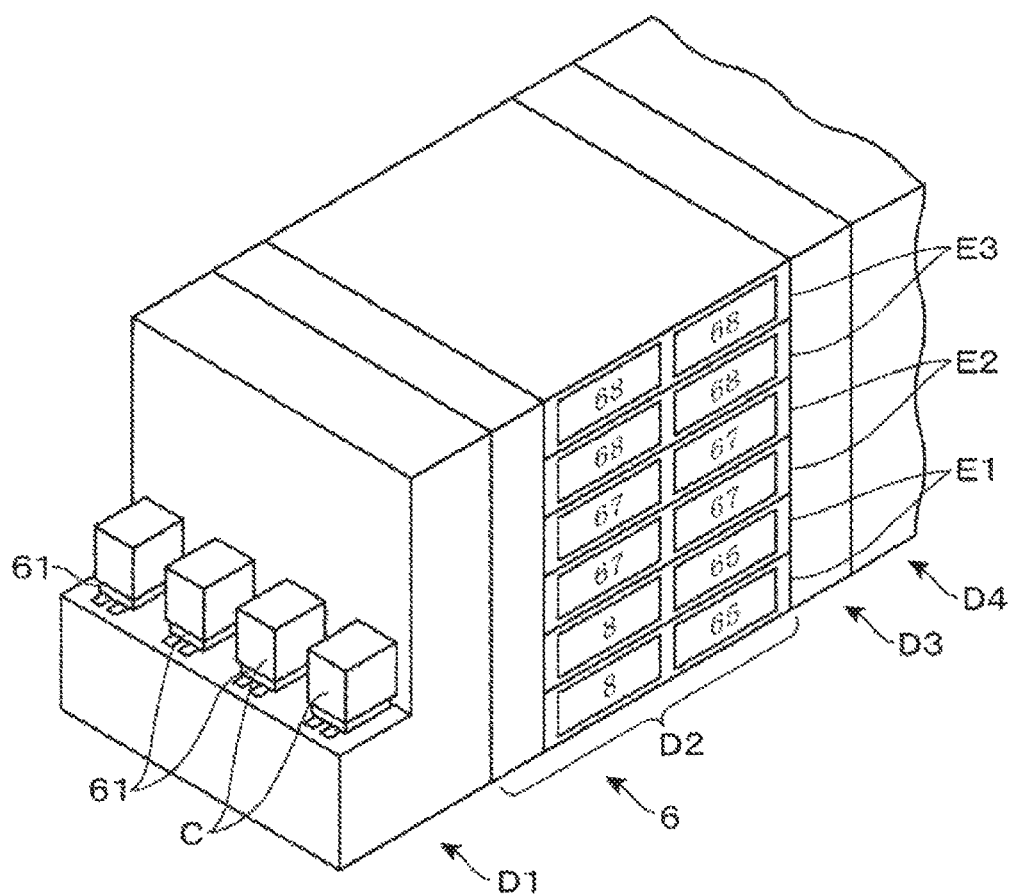
FIG. 11 is a perspective view of the coating/developing apparatus.
Figure 12:
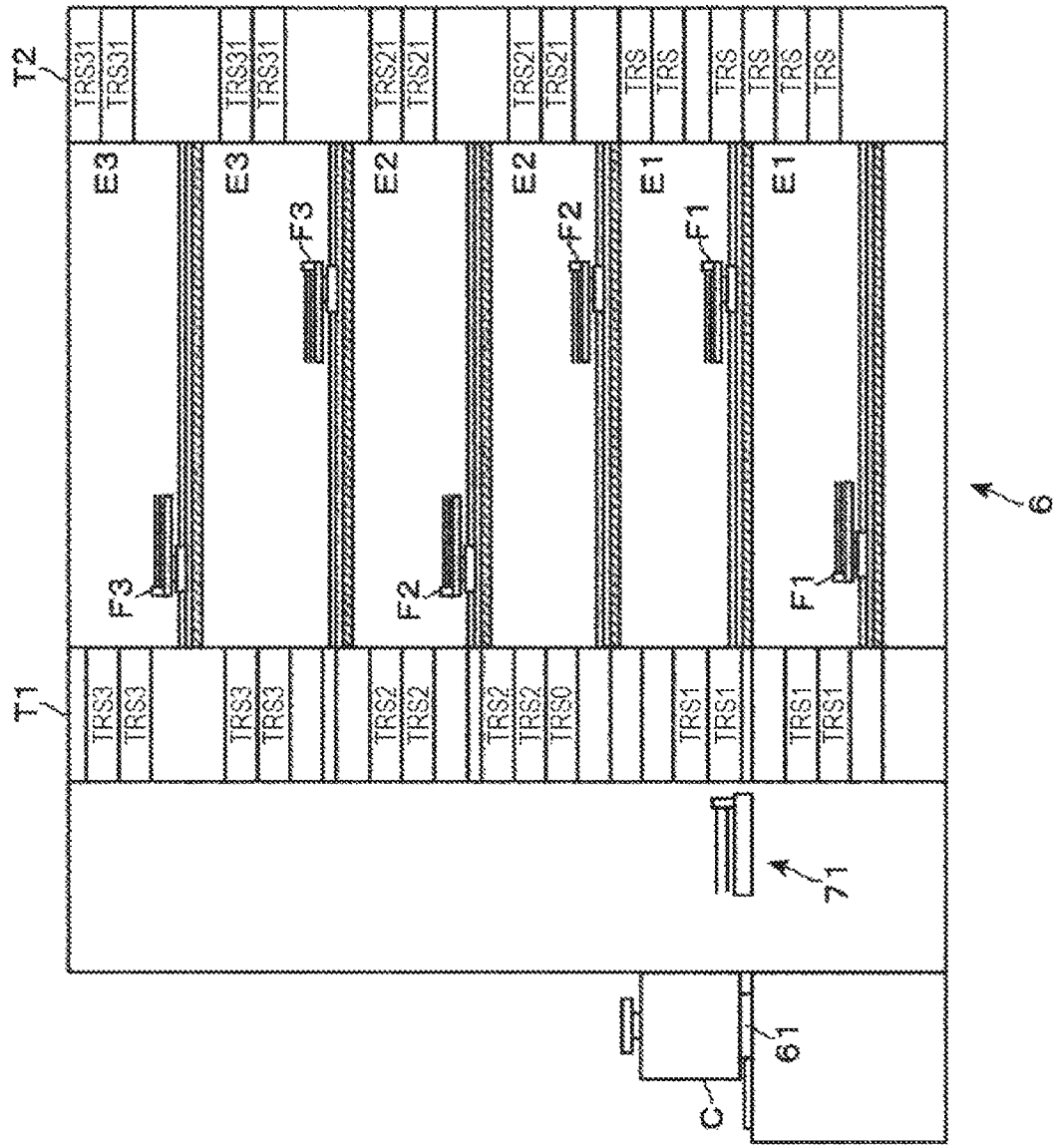
FIG. 12 is a longitudinal sectional side view of the coating/developing apparatus.
Figure 14A:
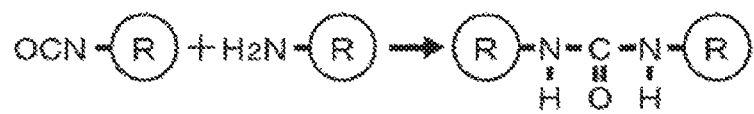
FIGS. 14A to 14D are explanatory views illustrating states where a polymer having a urea bond becomes an oligomer.
Figure 14B:
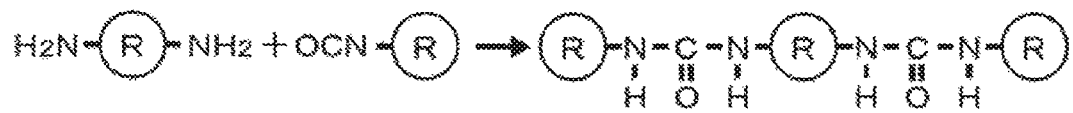
Figure 14C:
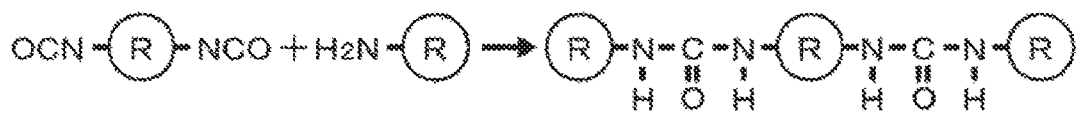
Figure 14D:
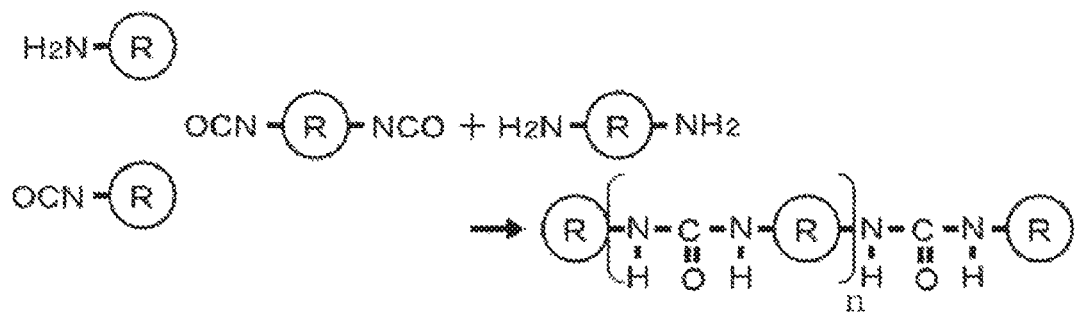

Next, a coating/developing apparatus 6 which is a substrate processing apparatus will be described. This coating/developing apparatus 6 is an apparatus for performing a series of processes from the formation of the polyurea film 23 described in FIG. 1C to the formation of the resist film 26 and the resist pattern described in FIG. 2E. Hereinafter, the coating/developing apparatus 6 will be described with reference to FIGS. 10, 11 and 12, which are a plan view, a perspective view and a schematic longitudinal side view thereof, respectively.

The coating/developing apparatus 6 is configured by linearly connecting a carrier block D1, a processing block D2 and an interface block D3. An exposing device D4 is connected to the interface block D3. In the following description, a direction in which the blocks D 1 to D 3 are arranged is assumed to be a forward-backward direction. The carrier block D1 includes mounting tables 61 for the carriers C, opening/closing parts 62 configured to be opened and closed together with covers of the carriers C, which are installed in the fronts of the carriers C mounted on the mounting table 61, and a transfer mechanism 63 for transferring the wafers W between insides of the carriers C and an inside of the carrier block D1 through the respective opening/closing parts 62.

The processing block D2 is configured with six unit blocks E which are stacked in order from below and perform a liquid process on the wafers W. As for the six unit blocks E, three types of two-layered pairs of respective unit blocks E1, E2 and E3 are disposed one above another, and the same type of unit blocks has the same configuration to perform the same process. Moreover, the wafer W is independently transferred and processed in each of the unit blocks E.

The unit block E1 shown in FIG. 10 will be described. A transfer region 64 for the wafer W is defined from the carrier block D1 toward the interface block D3. A plurality of heating modules 60 serving as heating processing parts are installed at one of left and right sides of the transfer region 64 in the forward-backward direction. A masking-film forming module 8 serving as a film forming part and a liquid chemical applying module 65 for forming the mask film 24 are installed at the other of the left and right sides of the transfer region 64. The masking-film forming module 8 applies a liquid chemical to the surface of the wafer W to form the polyurea film 23. A configuration of the masking-film forming module 8 will be described later in detail. The liquid chemical applying module 65 is a module for applying a liquid chemical onto the surface of the wafer W to form the mask film 24. A transfer arm F1 which is a transfer mechanism for the wafer W is installed in the transfer region 64.

The unit block E2 is configured in the same manner as the unit block E1 except that two resist applying modules 67 which are resist applying parts are installed instead of the masking-film forming module 8 and the liquid chemical applying module 65. The resist applying module 67 is a module for applying a resist as the liquid chemical onto the surface of the wafer W to form the resist film 26.

The unit block E3 is configured in the same manner as the unit block E1 except that two developing modules 68 are installed instead of the masking-film forming module 8 and the liquid chemical applying module 65. The developing module 68 as a developing part supplies a developing solution as the liquid chemical to the surface of the wafer W to develop the resist. The liquid chemical applying module 65, the resist applying module 67 and the developing module 68 are configured in the same manner as the masking-film forming module 8 except that the kinds of liquid chemicals to be supplied to the wafer W are different from each other. Similarly to the transfer arm F1 installed in the unit block E1, transfer arms installed in the unit blocks E2 and E2 are designated by F2 and F3, respectively. The heating module 60 installed in the unit block E2 is configured as a pre-exposure heating processing part for heating the wafer W with the resist applied thereon. The heating module 60 installed in the unit block E3 is configured as a post-exposure heating processing part for heating the wafer W that has been subjected to exposure.

At the side of the processing block D2 adjacent to the carrier block D1, there are installed a tower T1 which vertically extends over the six unit blocks E, and a transfer arm 71 which is a vertically movable transfer mechanism for transferring the wafer W with respect to the tower T1. The tower T1 includes a plurality of transfer modules TRS stacked one above another. The transfer modules installed respectively at heights of the unit blocks E1 to E3, can delivers and receive the wafers to/from the respective transfer arms F1 to F3 for the unit blocks E1 to E3.

Towers T2, T3 and T4 vertically extending over the six unit blocks E are installed in the interface block D3. Moreover, an interface arm 72 which is a vertically movable transfer mechanism for transfer the wafer W with respect to the tower T2 and the tower T3, an interface arm 73 which is a vertically movable transfer mechanism for transfer the wafer W with respect to the tower T2 and the tower T4, and an interface arm 74 which is a transfer mechanism for transfer the wafer W between the tower T2 and the exposing device D4 are further installed in the interface block D3.

The tower T2 is configured by stacking the transfer module TRS, a buffer module that stores and holds a plurality of wafers W before exposure process, a buffer module that stores a plurality of wafers W after exposure process, a temperature adjusting module for controlling the temperature of the wafer W and the like. However, the buffer module and the temperature adjusting module are not shown in the figure. Furthermore, although a module for transferring the wafer W is also installed in each of the towers T3 and T4, a description of these modules will be omitted herein.

Figure 10:
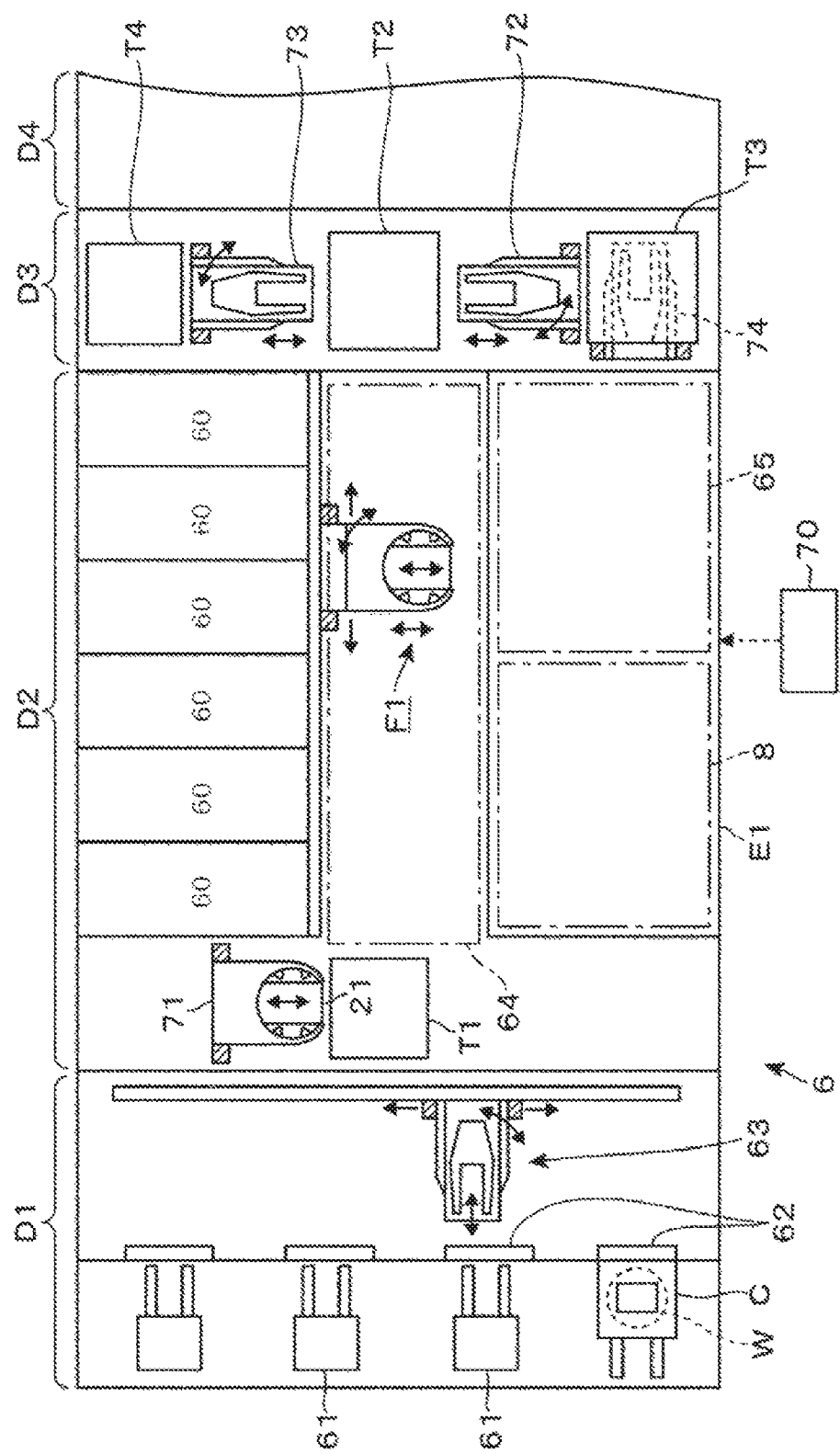
FIG. 10 is a plan view of a coating/developing apparatus for implementing the semiconductor device fabricating method.

Reference numeral 70 in FIG. 10 denotes a control part installed in the coating/developing apparatus 6, and is configured in the same manner as the control part 40 of the vacuum processing apparatus 4. As for a program constituting the control part 70, a group of instructions is programmed to output control signals to the respective parts of the coating/developing apparatus 6 so that the wafer W can be transferred and processed in each of the modules as will be described later.

The masking-film forming module 8 will be described with reference to FIG. 13. In FIG. 13, reference numeral 81 denotes a vacuum chuck serving as a mounting table which adsorptively holds the wafer W and is rotated by a rotation mechanism 80, reference numeral 82 denotes a cup module, and reference numeral 83 denotes a guide member composed of cylindrical outer and inner peripheral walls extending downward. Reference numeral 84 denotes a discharge space defined between an outer cup 85 and the outer peripheral wall to enable a gas and liquid to be discharged over the entire circumference. A lower portion of the discharge space 84 has a structure capable of separating the gas and liquid from each other. In FIG. 13, reference numeral 88 denotes a light emitting diode (LED) which irradiates the wafer W with light from below so as to heat the wafer. In order to perform polymerization when the liquid chemical is supplied to the wafer W as will be described later, the LED heats the wafer W.

A diamine solution (referred to as "first liquid chemical") described in FIG. 5 and a diisocyanate solution (referred to as "second liquid chemical") described in FIG. 5 are supplied from a supply source 87B and a supply source 87A to a liquid chemical nozzle 86, respectively. These solutions are met immediately before being supplied to the liquid chemical nozzle 86 to form a mixed solution. In other words, the first liquid chemical and the second liquid chemical are mixed just before they are supplied to the substrate. Then, the liquid chemical nozzle 86 discharges the mixed solution vertically downward. The liquid chemical nozzle 86 which is a raw material discharge part is connected to a driving mechanism (not shown) and is configured to move between a position above a central portion of the wafer W and outside the outer cup 85.

A process of the wafer W in the masking-film forming module 8 will be described. First, the mixed solution is supplied from the liquid chemical nozzle 86 constituting a raw material discharge part to the central portion of the wafer W and simultaneously the wafer W is rotated at a predetermined number of revolutions, so that the mixed solution is spread on the surface of the wafer W. In other words, each of the first liquid chemical and the second liquid chemical is spin-coated on the wafer W. Then, the polyurea film 23 is formed on the surface of the wafer W by the mixed solution.

Meanwhile, a film may be formed by supplying one of the first liquid chemical and the second liquid chemical and subsequently supplying the other liquid chemical to the wafer W. In this case, the liquid chemical nozzle 86 for diamine, which is connected to the supply source 87B, and the liquid chemical nozzle 86 for diisocyanate, which is connected to the supply source 87A, may be separately installed so that the liquid chemicals can be discharged from these liquid chemical nozzles 86 to the wafer W, respectively. Each of the liquid chemical nozzles 86 described above may be configured to discharge the liquid chemical supplied from the supply source, to the wafer W, in the form of mist. In some embodiments, when the mist is supplied to the wafer W, the liquid chemical nozzles may not be rotated with respect to the wafer W but may be in a stationary state.

A transfer path of the wafer in a system composed of the coating/developing apparatus 6 and the exposing device D4 will be described. The carrier C accommodating the wafer W on which the hard mask 22 has been formed as described with reference to FIG. 1B is mounted on the mounting table 61 of the carrier block D1 and is then transferred to the transfer module TRS0 of the tower T1 in the processing block D2 by the transfer mechanism 63. The wafer W is transferred from this transfer module TRS0 to the transfer module TRS1 (a transfer module which can transfer the wafer W by the transfer arm F1) corresponding to the unit block E1 by the transfer arm 71.

Thereafter, the wafer W is transferred from the transfer module TRS1 to the masking-film forming module 8 by the transfer arm F1. After the polyurea film 23 is formed, the wafer is transferred to the liquid chemical applying module 65 where the liquid chemical is applied on the wafer. Then, the wafer W is transferred to and heated by the heating module 60 so that a solvent in the liquid chemical is evaporated to form the mask film 24 as shown in FIG. 2D. Subsequently, the wafer W is transferred to the transfer module TRS1 and then to the transfer module TRS2 corresponding to the unit block E2 by the transfer arm 71.

Subsequently, the wafer W is transferred from the transfer module TRS2 to the resist applying module 67 by the transfer arm F2. After a resist is applied onto the wafer W, the wafer W thus applied is transferred to the heating module 60. In the heating module 60, a solvent in the resist is evaporated to form the resist film 26 on the mask film 24. Thereafter, the wafer W is transferred to the transfer module TRS21 of the tower T2 and is loaded into the exposing device D4 via the tower T3 by the interface arms 72 and 74. In the exposing device D4, the resist film 26 is exposed along a predetermined pattern. The wafer W thus exposed is transferred between the towers T2 and T4 by the interface arms 73 and 74 and is transferred to the transfer module TRS31 of the tower T2 corresponding to the unit block E3.

Then, the wafer W is transferred to the heating module 60 by the transfer arm F3 where the wafer W is subjected to a post-exposure bake. Thereafter, the wafer W is transferred to the developing module 68 where a developing solution is supplied to the wafer W, so that the resist pattern is formed as shown in FIG. 2E. Thereafter, the wafer W is transferred to the transfer module TRS3 corresponding to the unit block E3 of the tower T1 and is then returned to the carrier C by the transfer mechanism 63. Each process after the formation of the polyurea film 23 is performed at a temperature below the temperature at which the polyuria is depolymerized.

Figure 15A:
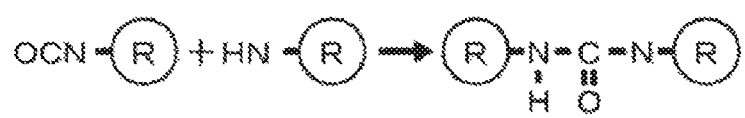
FIGS. 15A and 15B are explanatory views illustrating states where a polymer having a urea bond is produced using secondary amine.
Figure 15B:
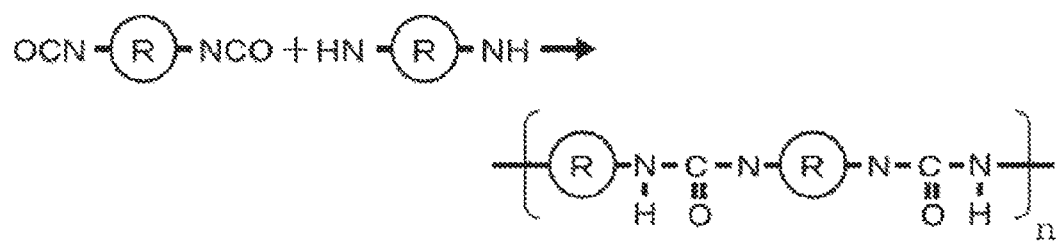

As shown in FIGS. 14A to 14D, a monofunctional molecule may be used as the raw material monomer. As shown in these figures, a urea film formed on the wafer W is not limited to a high molecular compound as in the polyurea film 23 described above but may be an oligomer. Furthermore, as shown in FIGS. 15A and 15B, isocyanate and secondary amine may be employed. In this case, a bond included in a produced polymer is also a urea bond.

Figure 16A:
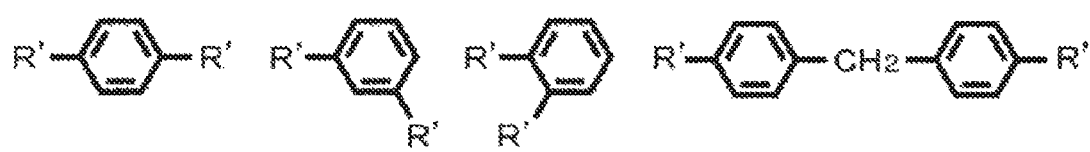
FIGS. 16A to 16D are explanatory views illustrating configurations of atomic groups constituting isocyanate and amine.
Figure 16B:
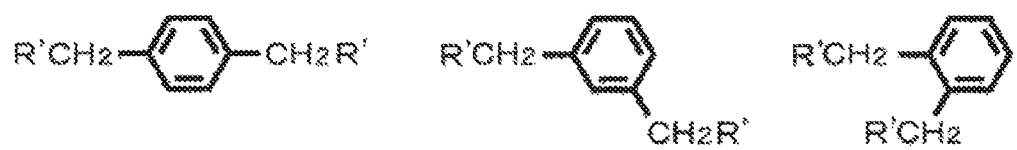

FIGS. 16A to 16D show examples of the structure of R which is an atomic group in a reaction formula of FIG. 6, wherein R' in structural formulas of FIGS. 16A to 16D is NCO or $NH_2$. As shown in FIGS. 16A and 16B, R may contain a benzene ring. FIG. 16A shows a structure in which no carbon is present between the benzene ring contained in R and nitrogen constituting amine and diisocyanate, and FIG. 16B shows a structure in which carbon is present between the benzene ring contained in R and nitrogen constituting amine and diisocyanate. As shown in FIG. 16A, there is concern that the polyurea film 23 formed using the compound having no carbon may be modified by light. However, as shown in FIG. 16B, the use of the compound containing carbon can form the polyurea film 23 having relatively high light resistance and film strength.

Figure 16C:
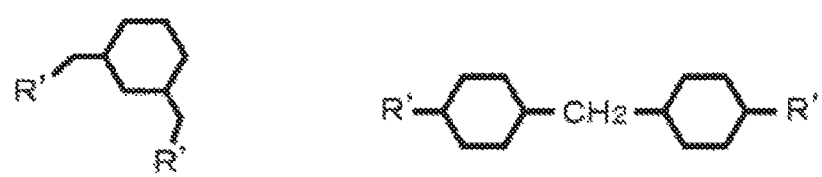
Figure 16D:
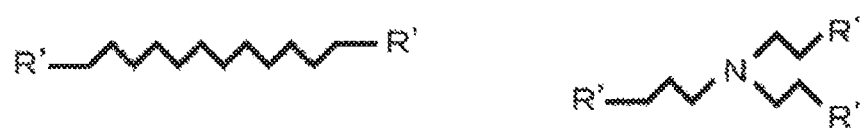

Furthermore, R may have alicyclic hydrocarbon as shown in FIG. 16C. The use of the compound having such a structure can form the polyurea film 23 having relatively high transparency. Further, as shown in FIG. 16D, R may be composed of an aliphatic. In this case, the polyurea film 23 has relatively high flexibility. FIG. 16D shows an example in which R has a straight chain of carbon and an example in which R is tertiary amine. In the example having the straight chain, the number of carbons constituting the straight chain is, for example, 2 to 18. By making R constituting the raw material monomers shown in FIGS. 14A to 14D and 15A and 15B to have the benzene ring, the alicyclic hydrocarbon and the aliphatic as described above, it is possible to impart the aforementioned properties to the polyurea film 23.

In the aforementioned examples, the mask of the polyurea film 23 is formed on the low-k film 20 which is the interlayer insulating film. There is an advantage that it is possible to suppress the damage to a film formed below the mask when the mask of the poly urea film 23 is removed as described above. Thus, it is possible to form the mask of the polyurea film 23 on an etching target film other than the interlayer insulating film. At this time, the damage to the etching target film due to the removal of the mask may also be suppressed even after etching of the etching target film. Further, the method of removing the polyurea film 23 is not limited to loading the wafer W on the mounting table heated as described above. For example, the removal of the polyuria film may be performed by heating the wafer by the irradiation of the wafer W with infrared rays using a lamp heater or the like in a vacuum atmosphere. In addition, the present disclosure is not limited to the aforementioned embodiments, and the respective embodiments can be appropriately modified.

Next, evaluation tests related to the present disclosure will be described.

<Evaluation Test 1>

The interlayer insulating film, the polyurea film 23, the anti-reflection film and the resist film with a pattern formed thereon were formed on the wafer W in this order from below, the anti-reflection film was etched using the resist film as a mask, and the polyuria film 23 was then etched using the anti-reflection film as a mask. Then, the etching of the interlayer insulating film and the removal of the anti-reflection film were performed using the polyuria film 23 as a mask. Thereafter, the wafer W was heated at a temperature of 350 degrees C. for 1 hour.

Figure 17:
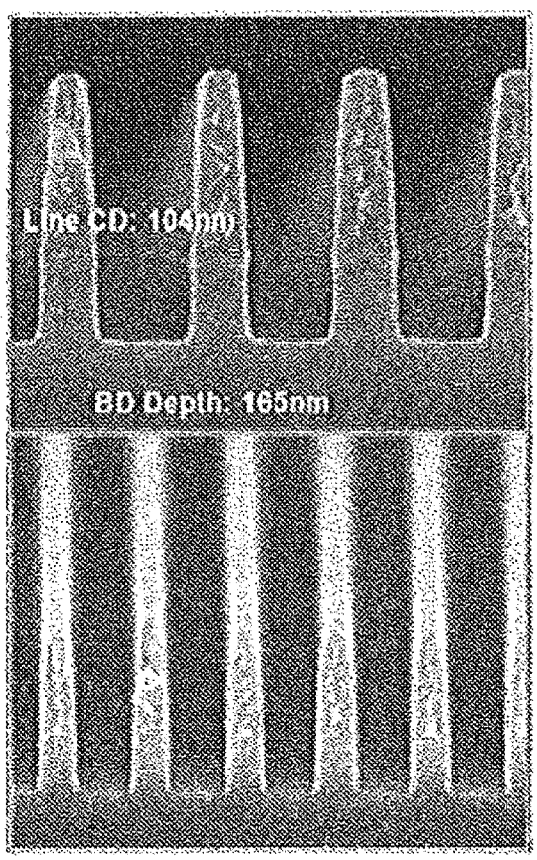
FIG. 17 is a scanning electron microscope photograph obtained in an evaluation test.
Figure 18:
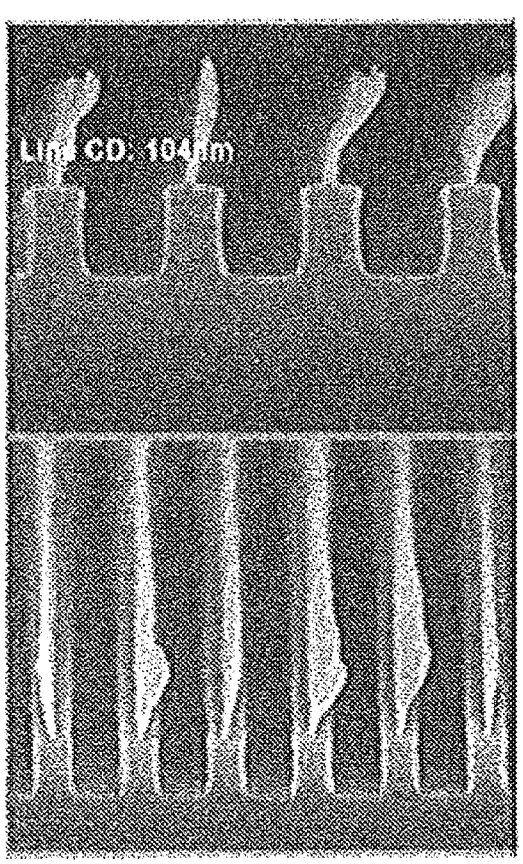
FIG. 18 is a scanning electron microscope photograph obtained in the evaluation test.

FIG. 17 is a photograph of the wafer W before heating process, and FIG. 18 is a photograph of the wafer W after heating process. The photographs were obtained by a scanning electron microscope. Upper portions in these figures are images obtained by photographing a longitudinal sectional side face of the wafer W, and lower portions are images obtained by photographing the upper surface of the wafer W in an oblique direction. FIG. 18 illustrates a state where the polyurea film 23 was disappearing by depolymerization.

<Evaluation Test 2>

Vapor generated by vaporizing H6XDA as amine and vapor generated by vaporizing H6XDI as isocyanate were supplied to the wafer W to form the polyurea film 23. In Evaluation Test 2, however, unlike the CVD apparatus 3 described with reference to FIG. 7, the film formation was performed using a CVD apparatus in which each vapor was supplied from one end side to the other end side of the wafer W in a horizontal direction. H6XDA was heated to 85 degrees C. and vaporized at a rate of 0.3 g/min. H6XDI was heated to 110 degrees C. and vaporized at a rate of 0.1 g/min. Each vapor was supplied to the wafer W for 300 seconds, and the internal pressure of the vacuum container 30 was set to 0.2 Torr (26.67 Pa). During the supply of the vapor, the temperature of the wafer W was changed whenever each process was performed, and was set to 80 degrees C., 70 degrees C. or 60 degrees C. For the wafer W on which the film formation had been performed, the film thicknesses at respective portions of the polyurea film 23 formed within a plane of the wafer W were measured.

In a case where the temperature of the wafer W is 80 degrees C., an average value of the film thicknesses of the polyurea film 23 was 54 nm, a maximum value was 65 nm, a minimum value was 40 nm and 1σ was 13%. In a case where the temperature of the wafer W is 70 degrees C., the average value of the film thicknesses of the polyurea film 23 was 144 nm, the maximum value was 188 nm, the minimum value was 92 nm and 1σ was 20%. In a case where the temperature of the wafer W is 60 degrees C., the average value of the film thicknesses of the polyurea film 23 was 297 nm, the maximum value was 468 nm, the minimum value was 142 nm and 1σ was 34%. As described above, it was confirmed from Evaluation Test 2 that it is possible to form the polyurea film by supplying the amine vapor and the isocyanate vapor to the wafer W.

<Evaluation Test 3>

The polyurea film 23 was formed on the surface of the wafer W, and a film thickness of the polyurea film 23 was measured. Thereafter, the wafer W was mounted on and heated by a hot plate for 5 minutes. Then, the film thickness of the polyurea film 23 was measured. Such processes and the film thickness measurements were performed for a plurality of wafers W. The heating temperature of the wafer W was changed in a range of 150 degrees C. to 450 degrees C. whenever each process is performed. The polyurea film 23 was formed on the wafer W using one selected from a first compound, a second compound, and a third compound. These first to third compounds had the molecular structure shown in FIG. 6 but had different atomic groups R in the structural formula. In Evaluation Test 3, tests in the polyurea films 23 was formed using the first compound, the second compound and the third compound are assumed to be Evaluation Tests 3-1, 3-2 and 3-3, respectively.

Figure 20:
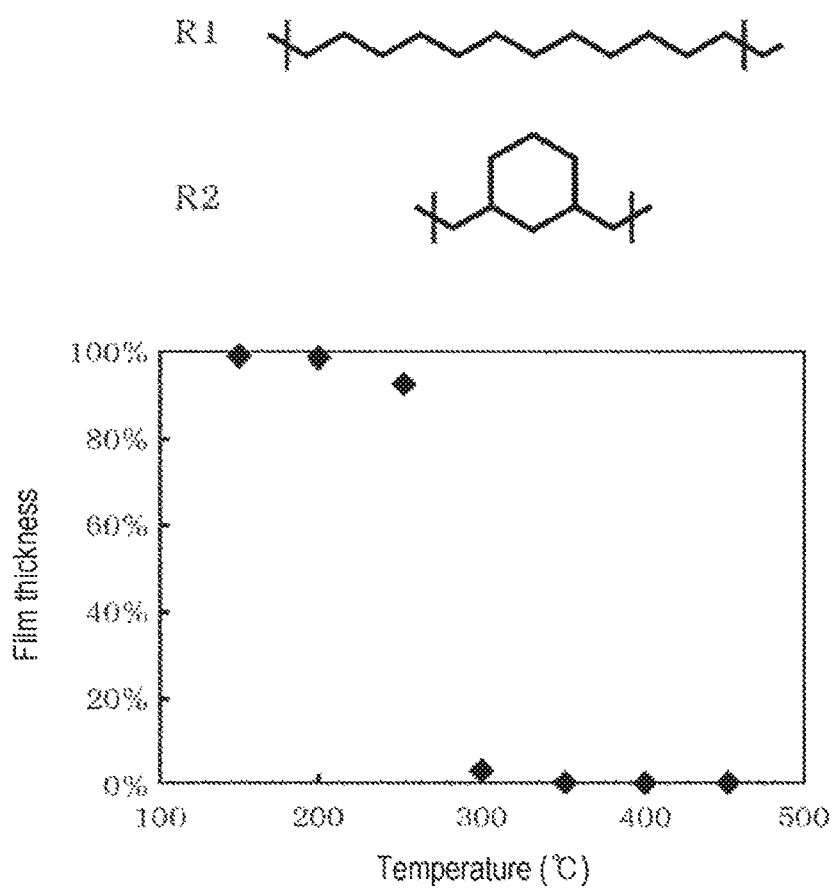
FIG. 20 is a graph showing the results of an evaluation test.

FIGS. 19 to 21 are graphs showing the results of Evaluation Tests 3-1 to 3-3, respectively. A horizontal axis of each of the graphs indicates the temperature of the wafer W (unit: degrees C.), and a vertical axis of each of the graphs indicates a percentage of the film thickness of the wafer W after heating process when the film thickness of the wafer W before heating process is assumed to be 100%. In addition, FIGS. 19 to 21 show Rs constituting the polyurea films 23 used in Evaluation Tests 3-1 to 3-3, wherein R1 is R derived from amine and R2 is R derived from isocyanate.

As shown in the graphs, the film thickness was 30% or less at a heating temperature of 300 degrees C. and the film thickness was 0% at a temperature of 350 degrees C. or higher in Evaluation Tests 3-1 to 3-3. From these results, it is considered that the polyurea film 23 can be decomposed by the heating regardless of the molecular structure, and that the heating at the temperature of 350 degrees C. or higher enables the depolymerization to securely occur.

<Evaluation Test 4>

The evaluation test 4 was performed in the same manner as Evaluation Test 2 except that the polyurea film 23 was formed by the liquid process as described above.

Figure 22:
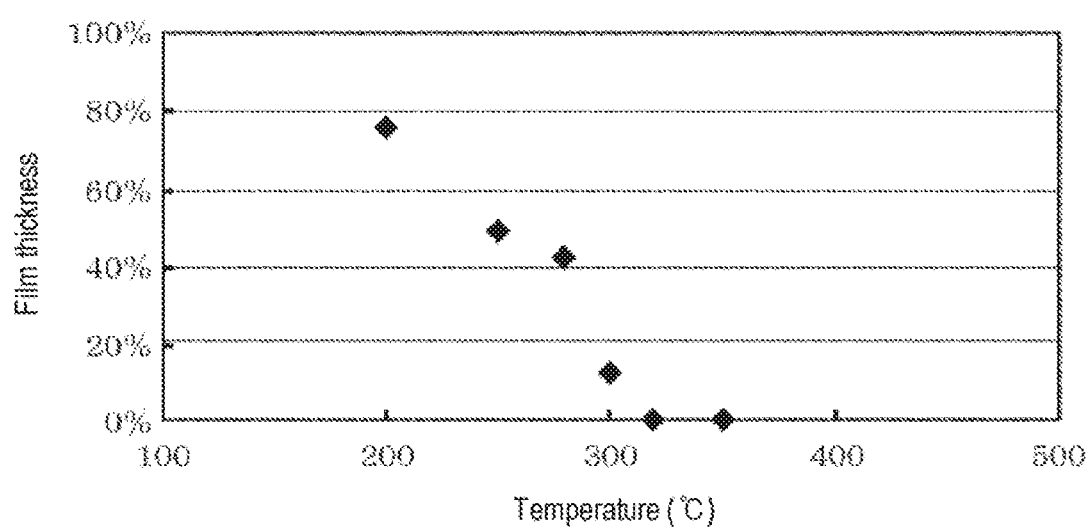
FIG. 22 is a graph showing the results of an evaluation test.

Similarly to the respective graphs of Evaluation Test 3, the graph of FIG. 22 shows the results of Evaluation Test 4. As shown in the graph, the film thickness was 30% or less at a heating temperature of 300 degrees C. and the film thickness was 0% at a heating temperature of 350 degrees C. or higher in Evaluation Test 4. In Evaluation Test 4, a minimum temperature at which a film shrinkage is observed was 200 degrees C. From the results of Evaluation Test 4, it was confirmed that the polyurea film formed by the liquid process were also decomposed by the heating.

According to the present disclosure, a masking film made of a polymer having a urea bond is formed by supplying raw polymerizing raw materials to a surface of a substrate with an etching target film formed thereon. After the etching target film is etched using an etching pattern formed on the masking film, the substrate is heated to depolymerize the polymer, thereby removing the masking film. This eliminates the need for generating plasma to remove the masking film. Accordingly, it is possible to avoid any damage to the etching target film due to the plasma, thus simply performing a process of removing the masking film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of fabricating a semiconductor device by performing a process on a substrate, comprising:
    forming a masking film made of a polymer having a urea bond by supplying polymerizing raw materials to a surface of the substrate on which an etching target film is formed;
    forming an etching pattern on the masking film;
    subsequently, etching the etching target film with a processing gas using the etching pattern; and
    subsequently, removing the entire masking film by heating the substrate to a temperature range from 300 degrees C. to less than 350 degrees C. to depolymerize the polymer,
    wherein the step of forming the masking film includes copolymerizing an isocyanate and an amine to form the urea bond, and
    wherein the amine is 1,12-diaminododecane (DAD) and the isocyanate is 1,3-bis (isocyanatomethyl) cyclohexane ($H_6XDI$).

2. The method of claim 1, wherein the step of forming the masking film includes heating the substrate so as to polymerize the isocyanate and the amine while supplying an isocyanate vapor and an amine vapor to the etching target film.

3. The method of claim 1, wherein the step of forming the masking film includes heating the substrate so as to mix the isocyanate and the amine and to subject the mixture to a polymerization reaction on the surface of the substrate, while supplying a liquid isocyanate and a liquid amine to the etching target film.

4. The method of claim 1, wherein the etching target film is an insulating film.

5. The method of claim 4, wherein the etching target film is an interlayer insulating film.

6. The method of claim 5, wherein the interlayer insulating film is an insulating layer containing silicon, carbon and oxygen.

* * * * *